United States Patent [19]

Spence

[11] Patent Number: 4,862,096

[45] Date of Patent: Aug. 29, 1989

[54] PROGRAMMABLE MULTIPHASE SEQUENCE CONTROLLER

[75] Inventor: Gary A. Spence, Beaverton, Oreg.

[73] Assignee: Tektronix, Inc., Beaverton, Oreg.

[21] Appl. No.: 49,638

[22] Filed: May 13, 1987

[51] Int. Cl.⁴ .............................................. H03K 3/00
[52] U.S. Cl. ...................................... 328/75; 328/55;
   328/105; 328/155; 328/153; 307/265
[58] Field of Search ........ 364/140, 569, 200 MS File,
   364/900 MS File; 328/55, 72, 75, 105, 152, 153,
   155; 377/43; 307/265, 260, 269

[56] References Cited

U.S. PATENT DOCUMENTS

| | | | |
|---|---|---|---|
| 3,651,414 | 3/1972 | Jamieson | 377/43 |
| 3,805,167 | 4/1974 | Nash et al. | 307/260 |
| 3,921,079 | 11/1975 | Heffner et al. | 328/105 |
| 4,191,998 | 3/1980 | Carmody | 364/200 |
| 4,414,637 | 11/1983 | Stanley | 364/900 |
| 4,564,953 | 1/1986 | Werking | 307/265 |
| 4,623,845 | 11/1986 | Ide | 307/269 |

Primary Examiner—Allen MacDonald
Attorney, Agent, or Firm—Daniel J. Bedell; William S. Lovell

[57] ABSTRACT

A sequence controller includes a plurality of time slice modules, each producing an adjustable number of sequentially asserted time slice signals, and a plurality of phase generators each having as input the time slice signals produced by an associated one of the time slice modules. Each phase generator produces a square wave output signal, the timing of the rising and trailing edges of each pulse thereof being determined by a selectable pair of its input time slice signals. A state machine monitors time slice signals produced by the time slice modules and transmits a separate enable signal to each time slice generator in response to the time slice signals. Each of the time slice modules produces time slice signals only when output enabled by an enable signal from the state machine.

9 Claims, 3 Drawing Sheets

PROGRAMMABLE MULTIPHASE SEQUENCE CONTROLLER

BACKGROUND OF THE INVENTION

The present invention relates to sequence controllers in general and in particular to a sequence controller which produces a set of periodic control signals each having programmably determined frequency, relative phase relationship, duty cycle and periods of operation.

Many electronic circuits are controlled by complex patterns of high frequency clock signals which must have precisely controlled frequencies, phase relationships, duty cycles and periods of operation, but circuits needed to produce such clock signals are typically complex and expensive. Sequence controllers utilizing discrete logic can produce high frequency clock signals but typically cannot be easily modified in order to change the clock signal patterns produced. Programmable sequence controllers comprising high speed random access memories (RAMs) have been used in the past. When, for example, a RAM storing 8-bit data words is sequentially addressed while in a read mode, each output bit forms a separate clock signal which may oscillate according to the pattern of corresponding bits stored in the RAM, and each of the eight clock signals thus produced may have a different frequency, phase relationship and duty cycle. However, sequence controllers utilizing high speed RAMs are expensive and difficult to program and are often impractical when large numbers of clock signals having different periods, phase relationships, duty cycles and periods of operation are required.

SUMMARY OF THE INVENTION

In accordance with one aspect of the invention, a programmable, multiphase sequence controller comprises a system clock generator, a set of "time slice" modules, and a set of "phase generator" modules. The system clock generator produces a CLOCK signal applied as an input to each time slice module and as a state clocking input to a state machine. Each time slice module, when output enabled, produces a set of n "time slice" signals, each asserted once every P seconds where P=nmp, n and m being integers of independently adjustable value for each time slice module and p being the period of the input system CLOCK signal. The n time slice signals produced by a particular time slice module are sequentially asserted at regularly spaced intervals during each period of operation of the time slice module.

Each phase generator has as its input the n time slice signals produced by an associated one of the time slice modules, and each phase generator produces a separate output clock signal (CLK) in response thereto. The timing of the rising and falling edges of a CLK signal pulse produced by a phase generator is controlled by a selected pair of input time slice signals, and the phase and duty cycle of each CLK signal may be independently adjusted by appropriately selecting the time slice signals which control the timing of the rising and falling edges of its pulses. The period of the CLK signal produced by a phase generator is the same as the period P of its input time slice signals and can therefore be adjusted by adjusting the product of n and m of the time slice module producing the phase generator's input time slice signals. The value of n determines the number of time slice signals produced by the module during each period, and this in turn determines the resolution with which the relative phase and duty cycle of the CLK signal produced by each phase generator can be adjusted.

In accordance with another aspect of the invention, time slice signals are produced by each time slice module only when the time slice module is output enabled by an ENABLE signal, and when a time slice module is not output enabled, the phase generator or generators responsive to its output time slice signals cease generating output CLK signals. Thus the periods during which a CLK signal are produced by a phase generator are determined by the state of the ENABLE signal input to the associated time slice module.

In accordance with a further aspect of the invention, a selected one of the time slice signals produced by each time slice module is transmitted as an end-of-cycle (EOC) signal to a state machine to indicate whenever the time slice module has completed a cycle of operation during which it sequentially asserted each of its time slice signals once. The state machine produces ENABLE signals for output enabling each time slice module, and in the preferred embodiment of the invention, the state machine may be programmed to independently output enable/disable each one of the time slice modules according to a predetermined pattern of EOC signals received from the time slice modules.

The programmable sequence controller of the present invention is particularly suited for controlling an apparatus driven by a plurality of CLK signals, wherein the frequency, relative phase, duty cycle, and periods of operation of various CLK signals may differ and may require adjustment.

It is accordingly an object of the invention to provide a sequencing circuit for producing a plurality of clock signals of adjustable frequency, phase relationship, duty cycle and periods of operation.

The subject matter of the present invention is particularly pointed out and distinctly claimed in the concluding portion of this specification. However, both the organization and method of operation of the invention, together with further advantages and objects thereof, may best be understood by reference to the following description taken in connection with accompanying drawings wherein like reference characters refer to like elements.

DRAWINGS

DETAILED DESCRIPTION

Figure 1:
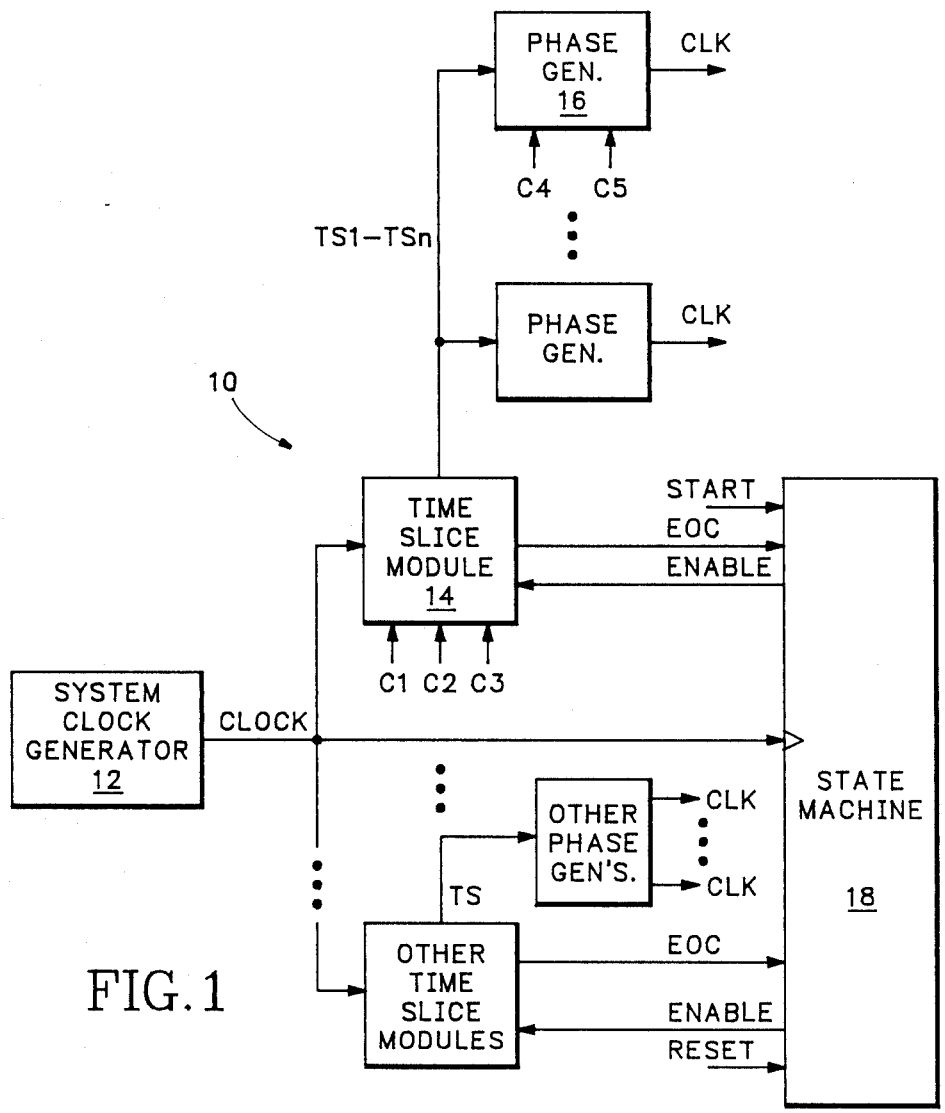
FIG. 1 is a block diagram of a programmable sequence controller according to the present invention.
Figure 2:
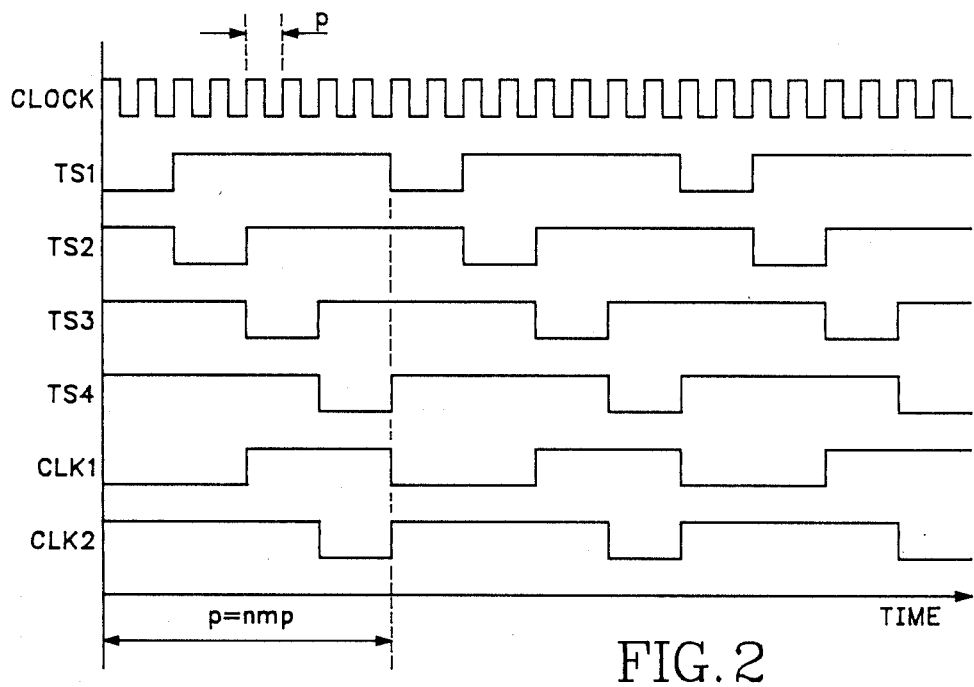
FIG. 2 is a diagram showing timing relationships between signals produced by the programmable sequence controller of FIG. 1.

With reference to FIG. 1, depicting in block diagram form a programmable sequence controller 10 in accordance with the present invention, controller 10 comprises a clock signal generator 12 which produces a system CLOCK signal of period p seconds applied as input to a plurality of "time slice" (TS) modules 14. Each time slice module 14, when output enabled, produces a set of n periodic time slice clock signals TS1–TSn, each having the same period P=nmp seconds, where n and m are integers selected according to applied input data C1 and C2, respectively. Although the separate TS clock signals have the same period, they are phase shifted by differing amounts such that the phase difference between any two time slice clock signals is an integer multiple of P/n. For example, as illustrated in the timing diagram of FIG. 2, when n is 4 for a particular time slice module, four time slice clock signals TS1–TS4 are generated. In the example of FIG. 2, m is set to 2 so that the period P=nmp of each time slice clock signal is 8 times the period p of the system CLOCK signal. Each time slice clock signal has a duty cycle of $1/n = \frac{1}{4}$ and the four time slice clock signals TS1–TS4 are shifted in phase from one another such that one and only one TS clock signal is low (asserted) at any time. Thus, the four time slice clock signals divide ("slice") period P into four time slices, one time slice corresponding to the assertion of each of the four TS clock signals.

With further reference to FIG. 1, controller 10 includes a plurality of "phase generators" 16. Each phase generator 16 has as its input the n time slice signals produced by an associated one of the time slice modules 14 and the time slice clock signals produced by any one time slice module may be applied as inputs to one or more phase generators 16. Each phase generator 16 produces a separate output clock signal (CLK), the timing of the rising and falling edges of CLK signal pulses being controlled by a selected pair of its input time slice signals. The selections of rising and falling edge controlling time slice signals are made according to rising and falling edge control input data C5 and C4, respectively.

In the example of FIG. 2 two CLK outputs (CLK1 and CLK2) are shown, CLK1 and CLK2 being produced by two phase generators 16 having the same time slice clock signals TS1–TS4 as inputs. The timing of the rising edge of CLK1 is controlled by TS3 and the timing of its falling edge is controlled by TS1. As may be seen from FIG. 2, CLK1 has a 50% duty cycle and its rising edge is phase shifted from the falling edge of TS1 by half a cycle of a TS clock signal, P/2 seconds. In contrast, the timing of the rising edge of CLK2 is controlled by TS1 and the timing of its falling edge is controlled by TS4 so that CLK1 has a 75% duty cycle and its rising edge is phase shifted from the falling edge of TS1 by three quarters of a TS clock signal cycle, 3P/4 seconds. Thus the duty cycle and relative timing (phase) of CLK1 and CLK2 can be independently adjusted by selecting which TS clock signals initiate CLK1 and CLK2 pulses and which TS clock signals terminate them. As the value of n associated with a particular time slice module increases, the number of its TS clock signal outputs increases. As the number of TS clock signal inputs to a particular phase generator increases, so too does the resolution with which the phase and duty cycle of its output CLK signal may be adjusted. The periods of CLK1 and CLK2 are determined by and are equal to the period P=nmp of the phase generator input TS clock signals. However, the periods of CLK signals produced by phase generators 16 driven by TS signals produced by different time slice modules 14 are independent of one another.

Thus the sequence controller 10 of the present invention is adapted to produce a plurality of output CLK signals each of which has an adjustable period, phase, and duty cycle. The period, phase and duty cycle of each CLK signal are independently adjustable when each time slice module 14 drives only a single phase generator 16. However, in many applications it is preferable to drive a particular set of phase generators with the same TS clock signals when the CLK signals they produce are to have similar periods but differing duty cycles and/or phases, because the periods (P=mnp) of the CLK signals produced by such set of phase generators 16 can be easily adjusted without changing the phase relationships between the CLK signals or their duty cycles by changing the value of m associated with the driving time slice module. This is advantageous, for example, in an application where the set of CLK signals is to control an apparatus in which the speed of operation of the apparatus is to be adjusted from time to time, because the speed adjustment may be performed without affecting duty cycles or phase relationships of the CLK signals simply by adjusting the value of m of a single driving time slice module.

Each time slice module 14 is adapted to provide a selected one of its TS clock signals as an output end-of-cycle (EOC) signal applied as input to a state machine 18, the selection being made according to input cycle timing control data C3. State machine 18 transmits a separate ENABLE signal to each time slice module 14, and each time slice module generates output TS clock signals only when its input ENABLE signal from state machine 18 is asserted. When the ENABLE signal input of a time slice module is deasserted, the phase generators 16 driven by TS signals from that time slice module freeze their CLK signal outputs in their current states. Thus, by selectively asserting and deasserting the ENABLE signals to the various time slice modules 14, state machine 18 can selectively run or freeze the various CLK signals produced by sequence controller 10. State machine 18 monitors the EOC signal inputs to determine when to run or freeze the CLK signals produced by the phase generators 16 driven by each particular time slice module 14. State machine 18 may be reset to an initial state by assertion of an externally generated RESET signal applied as input thereto. Following reset, operation of state machine 18 is enabled by assertion of a START signal input thereto. The ability to control the periods of operation of the various CLK signals is useful, for example, when providing clock signals to control an apparatus having several modes of operation, each mode requiring a separate set of input clock signals, wherein the apparatus is to switch from mode to mode in some predetermined fashion.

Figure 3:
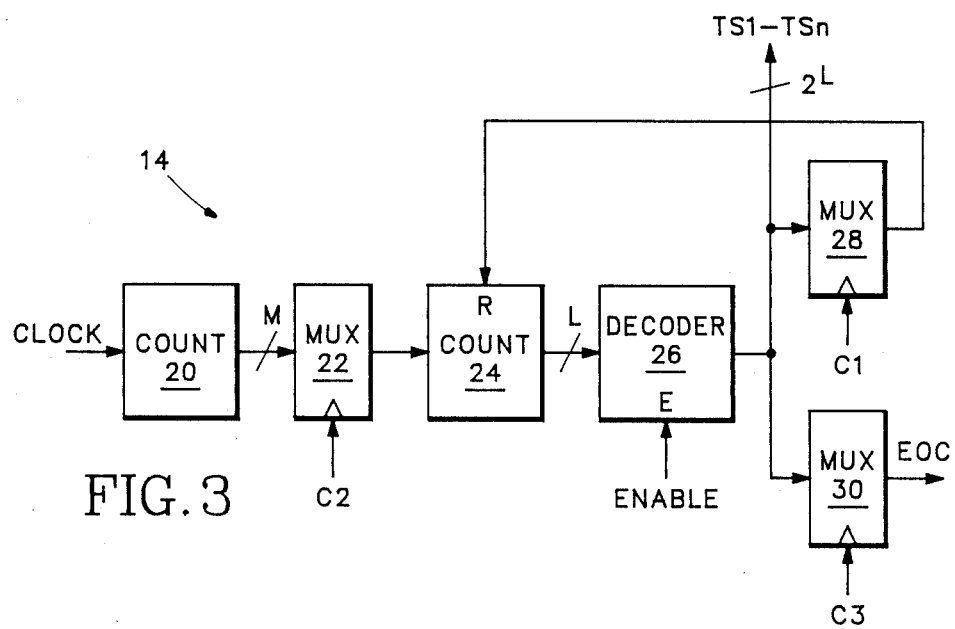
FIG. 3 is a block diagram of an embodiment of a time slice module of FIG. 1.

FIG. 3 shows a block diagram of a preferred embodiment of a time slice module 14 of FIG. 1. The CLOCK signal from system clock generator 12 of FIG. 1 drives an input of a counter 20 which produces an M-bit, binary encoded, parallel output signal. An M×1 multiplexer 22 connects one of the M output lines of counter 20 as an input to another counter 24, the line being selected according to the value of control data C2 applied to the control input of multiplexer 22. Counter 24 produces an L-bit binary encoded parallel output signal provided as input to a decoder 26. When enabled by the ENABLE signal from state machine 18, decoder 26 controls $2^L$ parallel output lines, each carrying a time slice clock signal asserted in response to a different output count produced by counter 24. These lines are connected to inputs of the phase generators driven by the time slice module so that each of the first n of the $2^L$ output signal lines of decoder 26 carries a separate one of the time slice clock signals TS1–TSn to the phase generators. The output lines of decoder 26 are also provided as inputs to a pair of $2^L \times 1$ multiplexers 28 and 30. Multiplexer 28 connects one of its $2^L$ input lines to a reset input of counter 24, the line being selected according to the value of control data C1 applied to the control input of multiplexer 28. Multiplexer 30 transmits a time slice clock signal carried on a selected one of the $2^L$ output lines of decoder 26 as the EOC signal to state machine 18 of FIG. 1, the selection being made according to switching control input data C3.

Counter 20 and multiplexer 22 comprise a "divide-by-N" circuit which produces an output signal of frequency 1/N times the frequency of the CLOCK signal. The value of N is determined by C2. For example, if counter 20 is a four bit counter (M=4), N may have values 1, 2, 4, 8 or 16 depending on which of the four output lines of counter 20 is selected by multiplexer 22 in response to the value of C2. Thus the period P=mnp of the TS clock signals produced by time slice module 14 may have values np, 2np, 4np, 8np, or 16np. In an alternative embodiment of the invention, a decoder similar to decoder 26 may be inserted between counter 20 and multiplexer 22. In such case, the period of the TS clock signals could be adjusted to have values P=np, 1np, 2np, 3np, ... $2^M$np, thereby providing improved resolution in the control over the period of the TS clock signals.

Counter 24, decoder 26 and multiplexer 28 cooperate in feedback relation to control the number n of time slice signals TS produced. The output signals TS1 to TSn of decoder 26 are successively asserted as counter 24 counts from 0 to n−1. The value of control data n determines the count limit (n−1) of counter 24; when the magnitude of the count output of counter 24 reaches n−1, the TS signal carried on the nth output line of decoder 26 is asserted, and multiplexer 28 utilizes this signal to reset the count of counter 24 to 0, thereby causing decoder 26 to assert time slice signal TS1.

The value of C3 supplied to the control input of multiplexer 30 determines which particular TS clock signal is to be supplied as the end of cycle indicating signal EOC to state machine 18 of FIG. 1. Multiplexer 30 could be eliminated by supplying, for example, TS1 directly as the EOC signal input to state machine 18. However, use of multiplexer 30 provides improved flexibility in adjusting timing relationships between ENABLE signals provided to separate time slice modules because state machine 18 may monitor and act in response to any TS clock signal produced by any time slice module.

Figure 4:
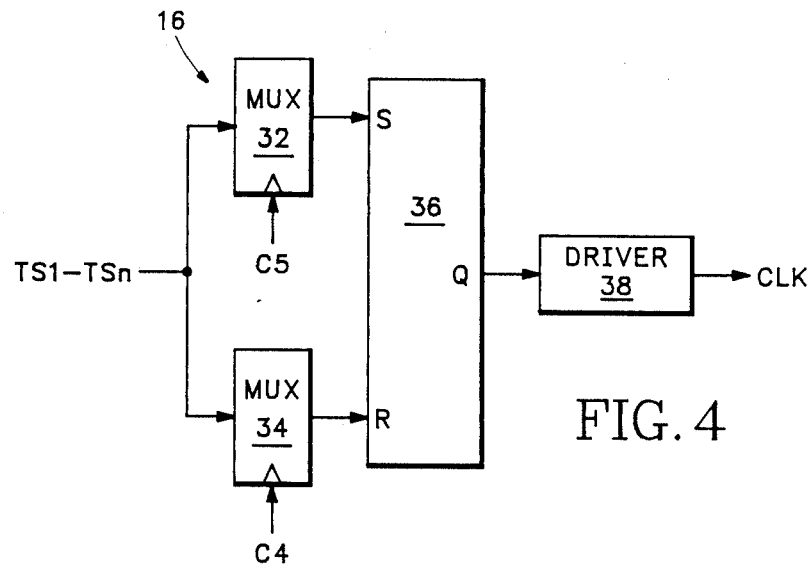
FIG. 4 is a block diagram of an embodiment of a phase generator module of FIG. 1.

FIG. 4 shows a block diagram of a preferred embodiment of a phase generator 16 of FIG. 1. The $2^L$ output lines of decoder 26 of FIG. 3 are applied as inputs to a pair of multiplexers 32 and 34. The output of multiplexer 32 controls a set input S of an RS flip-flop 36 and the output of multiplexer 34 controls the reset input R of the flip-flop. The Q output of flip-flop 36 is supplied as an input to a driver circuit 38 which produces the CLK signal in response thereto. The rising edge control data C5 controls the switching state of multiplexer 32 and the falling edge control data C4 controls the switching state of multiplexer 34. When the TS signal carried on an input line selected by multiplexer 32 in response to the value of C5 is asserted, the Q output of flip-flop 36 is driven high. When the TS signal carried on an input line selected by multiplexer 34 selected according to the value of C4 is asserted, the Q output of flip-flop 36 is driven low. Thus, the state of the input to driver 38 is determined by the states of any two TS clock signals selected by multiplexers 32 and 38. Driver 38 suitably comprises an amplifier having gain and offset adjusted to produce the CLK signal output of high and low logic levels as required by the device being controlled by the CLK signal.

Figure 5:
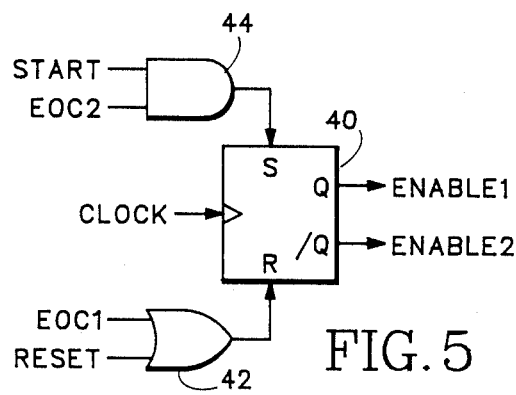
FIG. 5 is a block diagram of an embodiment of the state machine of FIG. 1.

Circuits suitable for carrying out the function of a state machine are known in the art and the choice of circuit to implement state machine 18 depends on the intended application. For example, in a simple application where only two time slice modules are to be enabled in an alternating fashion, state machine 18 suitably comprises an RS flip-flop 40 clocked by the system CLOCK signal as shown in FIG. 5. An OR gate 42 OR's the EOC output signal (EOC1) of a first time slice module with the RESET signal to drive the reset input R of flip-flop 40. An AND gate 44 AND's the EOC output signal (EOC2) of the second time slice module with the START signal to produce a signal which drives the set input S of the flip-flop. The Q output of flip-flop 40 provides the ENABLE input signal (ENABLE1) to the first time slice module and the inverted Q output (/Q of flip-flop 40 provides the ENABLE input signal (ENABLE2) to the second time slice module. When the START signal is high, the first time slice module is enabled by the Q output for one cycle of operation, and the second time slice module is enabled by the /Q output for one cycle of its operation. Thus, the time slice modules are alternately enabled on a cycle-by-cycle basis.

Figure 6:
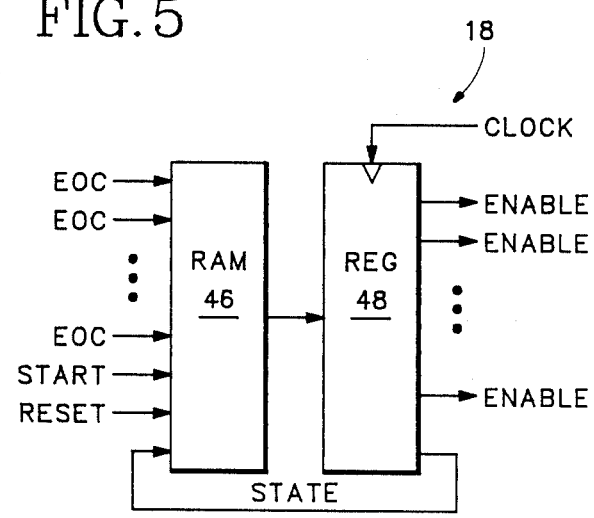
FIG. 6 is a block diagram of an alternative embodiment of the state machine of FIG. 1.

When many time slice modules are to be controlled, and when the order in which the time slice modules are to be enabled is to be programmably adjustable, state machine 18 suitably comprises the circuit shown in FIG. 6 including a random access memory (RAM) 46 and a register 48. The EOC output signals of the time slice modules and the START and RESET signals drive address input terminals of RAM 46. Data output terminals of RAM 46 are connected to input terminals of register 48 which is input enabled by the system CLOCK signal. A portion of the data bits stored in register 48 is supplied as ENABLE signals to the time slice modules, while the remaining bits stored in register 48 are fed back as state indicating data (STATE) to additional address terminals of RAM 46. By storing appropriate state data at various addresses in RAM 46, state machine 18 may be programmed to produce predetermined patterns of output ENABLE signal states in response to patterns of input EOC and STATE data signals at its address input terminals.

In alternative embodiments of the invention, the electronic multiplexers 22, 28, 30, 32 and/or 34 of FIGS. 3 and 4 may be replaced with manually operated switches or removable jumpers. Such alternative embodiments are suitable for use in applications in which the frequency, phase, or duty cycle of the various CLK signals are seldom or never changed once established.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

I claim:

1. A sequence controller comprising:
   means for generating a system clock signal of period p;
   means responsive to said system clock signal for generating a plurality of n periodic time slice signals, each time slice signal having a similar period P proportional to the product of n and p according to an integer constant of proportionality, phase relationships between said time slice signals being such that each said time slice signal is of a phase differing from phases of the other time slice signals;
   means for selecting first and second time slice signals from among said n time slice signals; and
   means for periodically generating an output pulse having a rising edge timed according to said first time slice clock signal and having a falling edge timed according to said second time slice clock signal.

2. The sequence controller in accordance with claim 1 wherein said integer constant of proportionality is adjustable.

3. The sequence controller in accordance with claim 1 wherein the magnitude of n is adjustable.

4. The sequence controller in accordance with claim 1 wherein said integer constant of proportionality is adjustable and wherein the magnitude of n is adjustable.

5. A sequence controller comprising:
   means for generating a periodic system clock signal;
   means for maintaining a count of periods of said system clock signal and for resetting said count to an initial value when said count reaches a predetermined count limit;
   means for generating a plurality of time slice signals, each time slice signal corresponding to a separate magnitude of said count, each time slice signal being of a first state when said count has the corresponding magnitude and of a second state when said count does not have the corresponding magnitude;
   means for selecting first and second time slice signals from among said plurality of time slice signals; and
   means for periodically generating an output pulse having a rising edge timed according to said selected first one of said time slice signals and having a falling edge timed according to said selected second one of said time slice signals.

6. A sequence controller comprising:
   means for generating a periodic system clock signal;
   means responsive to said system clock signal for producing a periodic output clock signal of period an adjustable integer multiple of the period of said system clock signal;
   means for maintaining a count of periods of said output clock signal, for resetting said count to an initial value when said count reaches a predetermined count limit, and for producing an encoded output signal representing the magnitude of said count;
   means for decoding said encoded output signal thereby generating a plurality of time slice signals, each time slice signal corresponding to a separate magnitude of said count, each time slice signal being of a first state when said count has the corresponding magnitude and of a second state when said count does not have the corresponding magnitude;
   means for selecting first and second time slice signals from among said plurality of time slice signals; and
   means for periodically generating an output pulse having a rising edge timed according to said selected first time slice signal and having a falling edge timed according to said selected second time slice signal.

7. A sequence controller comprising:
   a plurality of time slice means each periodically producing an adjustable number of sequentially asserted time slice signals; and
   a plurality of phase generator means, at least one phase generator means corresponding to each of said time slice means, each phase generator means having as input the time slice signals produced by its corresponding time slice means, each phase generator means producing a square wave output signal, the timing of the rising and falling edges of each pulse thereof being determined by a selectable pair of its input time slice signals.

8. The sequence controller according to claim 7 further comprising means for transmitting an enable signal to at least one of said plurality of time slice means in response to assertion of particular time slice signals produced by said plurality of time slice means, said at least one time slice means producing time slice signals only when output enabled by said enable signal.

9. A sequence controller comprising:
   means for generating a periodic system clock signal;
   a plurality of time slice means each comprising means responsive to said system clock signal for producing a periodic output clock signal of period an adjustable integer multiple of the period of said system clock signal, for maintaining a count of periods of said output clock signal, for resetting said count to an initial value when said count reaches a predetermined count limit, for producing an encoded signal representing the magnitude of said count, for decoding said encoded signal when output enabled by an input enable signal thereby generating a plurality of time slice signals, each time slice signal corresponding to a separate magnitude of said count, each time slice signal being of a first state when said count has the corresponding magnitude and of a second state when said count does not have the corresponding magnitude;
   a plurality of phase generator means, each receiving as input the time slice signals produced by a separate one of said time slice means, each phase generator means periodically generating an output pulse having a rising edge timed according to a selected first one of its input time slice signals and having a falling edge timed according to a selected second one of its input time slice signals; and
   means for transmitting a separate enable signal to each of said time slice means, each enable signal being of state determined according to the state of at least one of said time slice signals produced by said plurality of time slice means.

* * * * *